(12) United States Patent
Lee

(10) Patent No.: US 7,348,202 B2
(45) Date of Patent: Mar. 25, 2008

(54) CMOS IMAGE SENSOR AND METHOD FOR FABRICATING THE SAME

(75) Inventor: Chang Eun Lee, Seoul (KR)

(73) Assignee: Dongbu Electronics Co., Ltd, Seoul (KR)

( * ) Notice: Subject to any disclaimer, the term of this patent is extended or adjusted under 35 U.S.C. 154(b) by 0 days.

(21) Appl. No.: 11/320,701

(22) Filed: Dec. 30, 2005

(65) Prior Publication Data
US 2007/0092984 A1   Apr. 26, 2007

(30) Foreign Application Priority Data
Sep. 13, 2005   (KR) .................. 10-2005-0085108

(51) Int. Cl.
*H01L 21/00* (2006.01)

(52) U.S. Cl. .................. 438/57; 438/701; 257/E21.632

(58) Field of Classification Search .................. 438/57, 438/60, 65, 69, 70, 639, 640, 694, 695, 700, 438/701; 257/291–293, 444
See application file for complete search history.

(56) References Cited

U.S. PATENT DOCUMENTS

2004/0188740 A1* 9/2004 Beintner et al. ............ 257/302
2005/0058773 A1* 3/2005 Hasei et al. ................. 427/162
2005/0127462 A1* 6/2005 Rim et al. ................... 257/428
2006/0183265 A1* 8/2006 Oh et al. ....................... 438/65
2006/0240359 A1* 10/2006 Liu ............................. 430/313
2007/0082423 A1* 4/2007 Lee .............................. 438/60
2007/0152286 A1* 7/2007 Ahn ........................... 257/414

FOREIGN PATENT DOCUMENTS

| JP | 03-286566 | 12/1991 |
| JP | 2004-071931 | 3/2004 |

* cited by examiner

*Primary Examiner*—Michael Lebentritt
*Assistant Examiner*—Reema Patel
(74) *Attorney, Agent, or Firm*—McKenna Long & Aldridge LLP

(57) ABSTRACT

An image sensor includes a semiconductor substrate; a pixel array disposed on the semiconductor substrate; and an insulating interlayer, formed on the semiconductor substrate, having a trench coinciding with the disposition of the pixel array, the trench having uniformly inclined inner sidewalls.

4 Claims, 7 Drawing Sheets

CMOS IMAGE SENSOR AND METHOD FOR FABRICATING THE SAME

CROSS-REFERENCE TO RELATED APPLICATION

This application claims the benefit of Korean Patent Application No. 10-2005-0085108, filed on Sep. 13, 2005, which is hereby incorporated by reference as if fully set forth herein.

BACKGROUND OF THE INVENTION

1. Field of the Invention

The present invention relates to a image sensor and a method for fabricating the same. Although the present invention is suitable for a wide scope of applications, it is particularly suitable for enhancing image sensor characteristics.

2. Discussion of the Related Art

An image sensor is a semiconductor device that converts an optical image into an electrical signal. A complementary MOS (CMOS) image sensor includes a photosensing device, such as a photodiode, and a CMOS logic circuit made up of a plurality of MOS transistors corresponding to the number of pixels fabricated with CMOS technology. A three-transistor (3T) CMOS image sensor includes one photodiode and three transistors, and a four-transistor (4T) CMOS image sensor includes one photodiode and four transistors.

Referring to FIG. 1, a unit pixel of a general 3T-type CMOS image sensor includes one photodiode PD and three NMOS transistors Rx, Dx, and Sx. The cathode of the photodiode PD is connected to the drain of the first NMOS transistor Rx and the gate of the second NMOS transistor Dx. The sources of the first and second NMOS transistors Rx and Dx are connected to a power line supplying a reference voltage $V_R$, and a gate of the first NMOS transistor Rx is connected to a reset line supplying a reset signal. The source of the third NMOS transistor Sx is connected to the drain of the second NMOS transistor Dx. The drain of the third NMOS transistor Sx is connected to a read circuit (not shown). The gate of the third NMOS transistor Sx is connected to a row select line supplying a select signal.

Referring to FIG. 2, an active region 10 is defined in a unit pixel of the general 3T-type CMOS image sensor. A photodiode 20 is formed on a wide portion of the active region 10, and other parts of the active region are overlapped by three gate electrodes 120, 130, and 140 to configure a reset transistor Dx, a drive transistor Dx, and a select transistor Sx, respectively. The exposed portions of the active region 10 of each transistor is doped with impurity ions to become corresponding source/drain regions. A power voltage Vdd is applied to the source/drain regions between the reset and drive transistors Rx and Dx. A plurality of signal lines (not shown) are respectively connected to the gate electrodes and connect the source/drain region of the select transistor Sx to a read circuit (not shown). A pad is provided to each of the signal lines to connect to an external drive circuit.

FIGS. 3A-3F illustrate a method of fabricating a CMOS image sensor having a vertical photodiode structure according to the related art.

Referring to FIG. 3A, a pixel array 32, configured with a plurality of photodiodes for respectively sensing R, G, and B signals is formed in a photodiode area by selectively implanting impurity ions in a semiconductor substrate 31, thereby imparting a different depth to each of the three types of photodiode. A device (not shown) for signal processing is formed on the semiconductor substrate 310, including the pixel array 32. Multi-layer metal lines (not shown) are formed to connect the respective elements. An insulating interlayer 33 is formed over the semiconductor substrate 31. A protective layer 34 is formed to protect a device against moisture and impacts by forming an oxide layer on the insulating interlayer 33.

Referring to FIG. 3B, the protective layer 34 is coated with a photoresist, which is selectively patterned by exposure and development steps to form a photoresist pattern 35 exposing a portion of the protective layer 34 that overlaps the pixel array 32.

Referring to FIG. 3C, the exposed portion of the protective layer 34 is selectively removed using the photoresist pattern 35 as a mask, to form a pad opening that exposes a metal pad formed in a pad area of the semiconductor substrate 31.

Referring to FIG. 3D, the photoresist pattern 35 is removed. Then, photolithography is selectively carried out on the insulating interlayer 33 on the pixel array 32, including a dry etching process, to form a trench 36 having a predetermined depth in the insulating interlayer 33 on the pixel array 32.

Referring to FIG. 3E, the semiconductor substrate 31 and the trench 36 are coated with a microlens photoresist layer 37a.

Referring to FIG. 3F, the microlens photoresist layer 37a is selectively patterned. A reflowing process is carried out on the patterned photoresist layer to form a plurality of microlenses 37 on the insulating interlayer 33 to be spaced apart from one another within the trench 36.

The formation of the trench 36 effectively reduces the distance between the pixel array 32 and microlenses to be formed later so that enhanced photosensitivity may be obtained. In the trench, however, the vertical profiles of the insulating interlayer 33 and the protective layer 34, existing at the inner sidewalls of the trench 36, prevent the photoresist layer 37a from having a uniform thickness. That is, the thickness uniformity is degraded by a striation occurring while coating the trench with the microlens photoresist layer. The striation is impressed upon the under side of the photoresist layer 37a due to the sharp upper edge of the inner sidewalls of the trench 36 and is generated along the entire length of the trench, thereby thinning the photoresist layer at two sites that appear as stripes on either side of the trench.

SUMMARY OF THE INVENTION

Accordingly, the present invention is directed to an image sensor and method for fabricating the same that substantially obviates one or more problems due to limitations and disadvantages of the related art.

The present invention provides an image sensor and a method for fabricating the same, by which, in forming a trench to shorten a light path between a microlens and a photodiode, and an evenness in the thickness of a microlens photoresist layer is improved by preventing a striation occurring at the sidewalls of the trench.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages in accordance with the invention, as embodied and broadly described herein, there is provided a CMOS image sensor comprising a semiconductor substrate; a pixel array disposed on the semiconductor substrate; and an insulating interlayer formed on the semiconductor substrate and having a trench coinciding with the pixel array, the trench having uniformly inclined inner sidewalls.

According to another aspect of the present invention, there is provided a method of fabricating a CMOS image sensor, the method comprising disposing a pixel array in a semiconductor substrate; stacking an insulating interlayer and a protective layer on the semiconductor substrate, including the pixel array; selectively removing a portion of the protective layer over the pixel array; forming a trench in the insulating interlayer to coincide with the pixel array; and forming an inclined inner sidewall of the trench, the inclined inner sidewall including inner sidewall surfaces of the protective layer and the insulating interlayer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
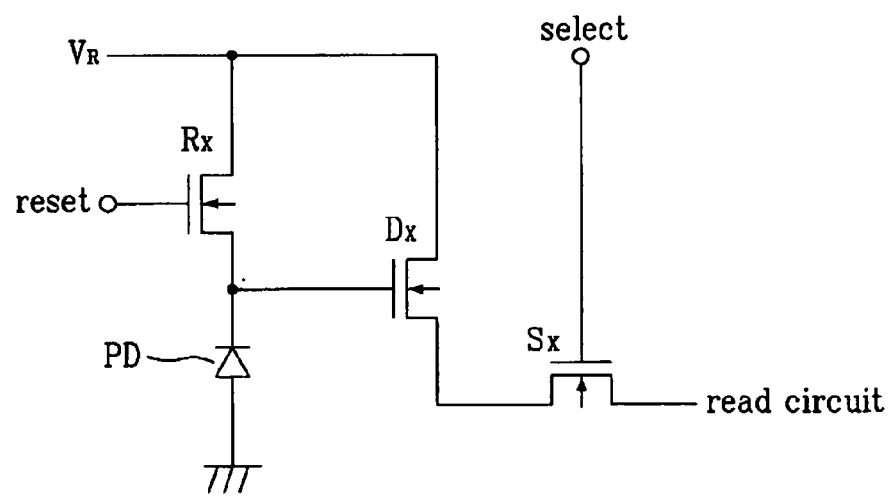
FIG. 1 is a circuit diagram of a unit pixel in a general 3T-type CMOS image sensor.
Figure 2:
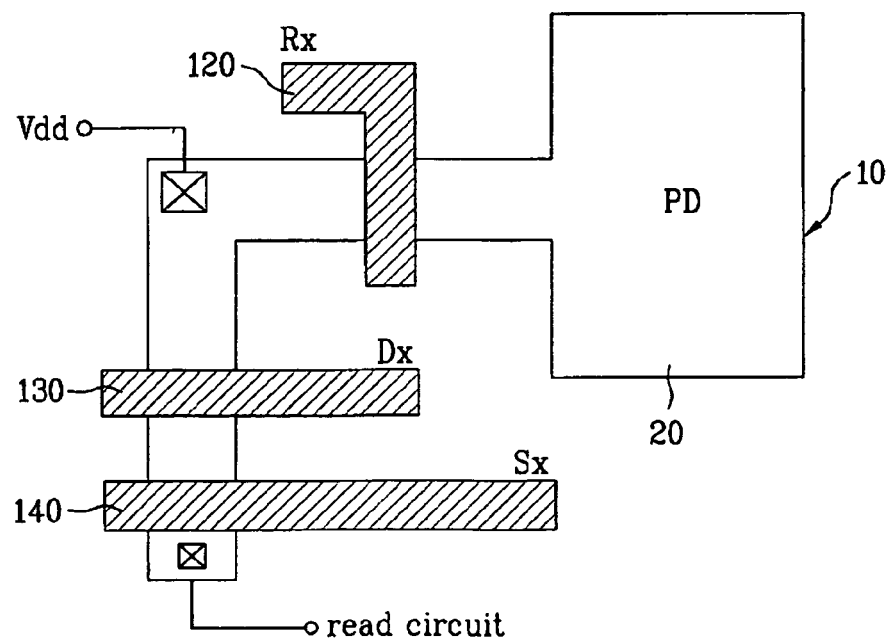
FIG. 2 is a layout diagram of the unit pixel of FIG. 1.
Figure 3A:
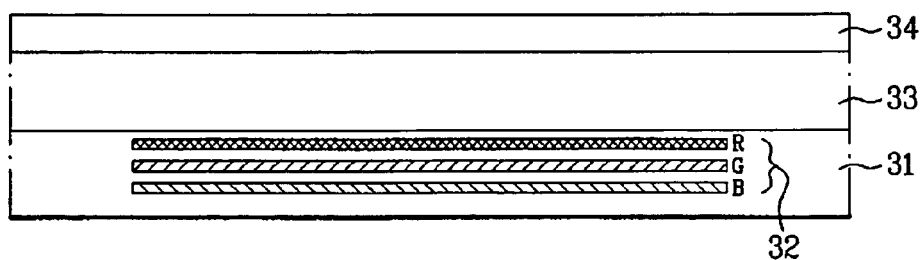
FIGS. 3A-3F are cross-sectional views of a conventional CMOS image sensor.
Figure 3B:
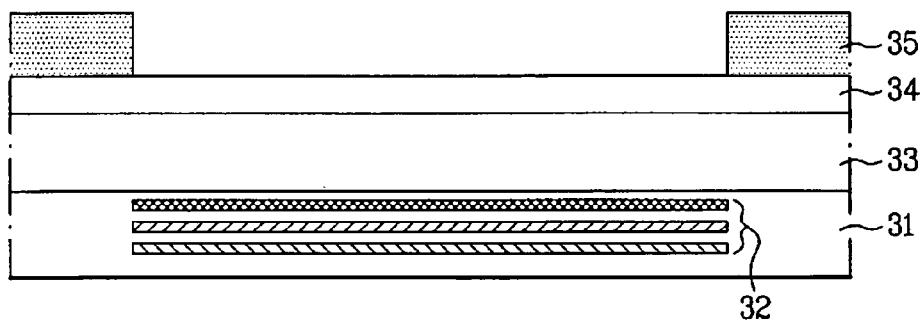
Figure 3C:
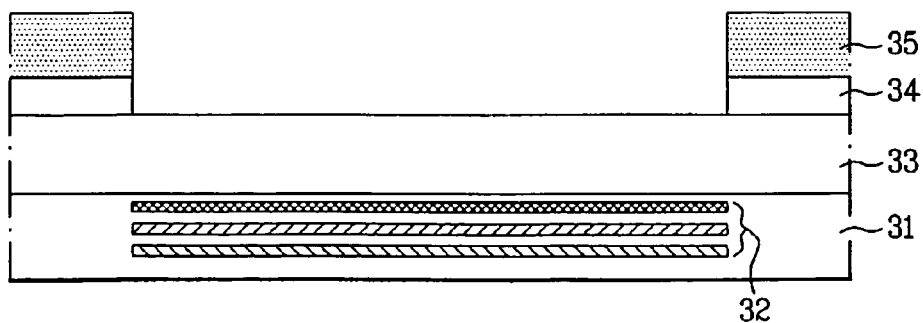
Figure 3D:
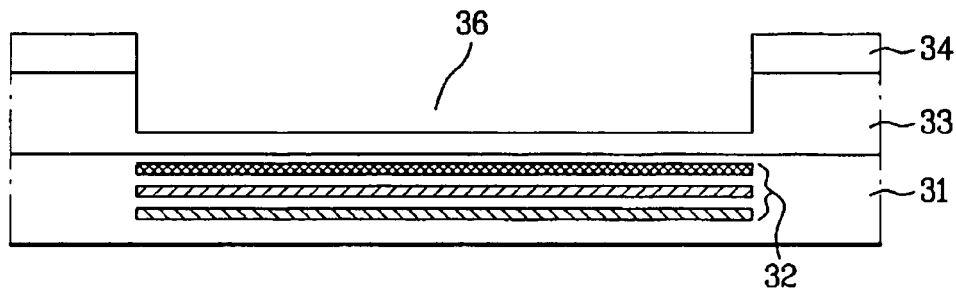
Figure 3E:
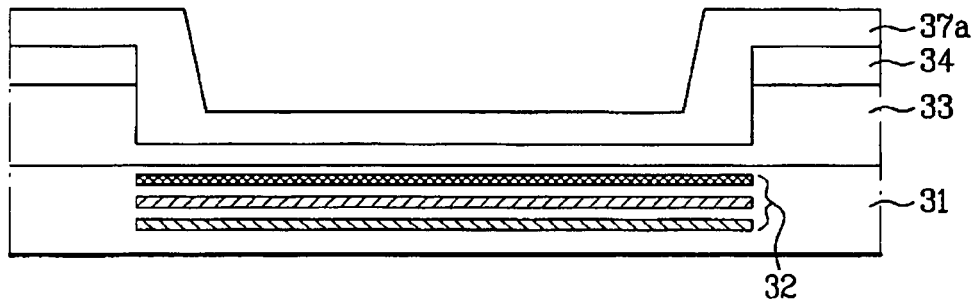
Figure 3F:
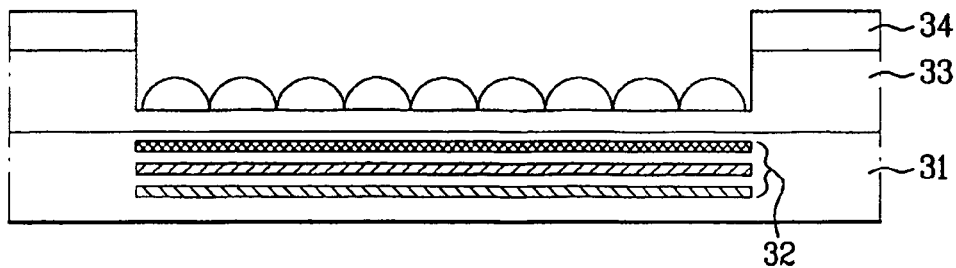
Figure 4:
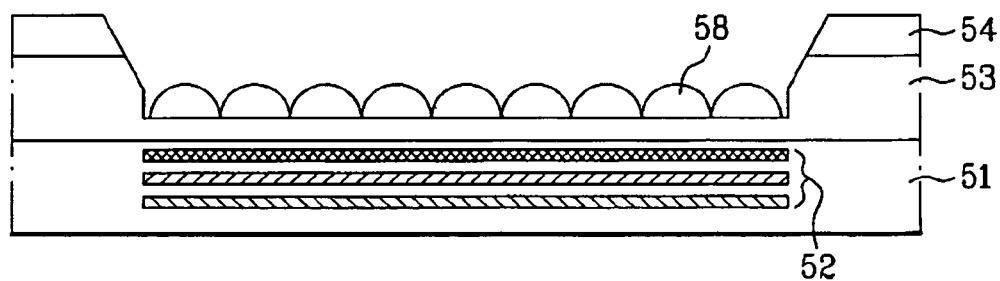
FIG. 4 is a cross-sectional view of an exemplary CMOS image sensor according to the present invention.

Referring to FIG. 4, a CMOS image sensor according to the present invention includes a semiconductor substrate 51 having a pixel array 52 provided to a photodiode region to include photodiodes sensing R (red), G (green) and B (blue) signals and differing in thickness, respectively, an insulating interlayer 53 on the semiconductor substrate 51, a trench 56 provided obliquely to the insulating interlayer 53 to overlap the pixel array 52 with a predetermined depth, and a plurality of microlenses 58 provided on the insulating interlayer 53 within the trench 56 to be evenly spaced apart from one another. A plurality of devices and metal lines (not shown) for signal processing are formed on the semiconductor substrate 51, without overlapping the pixel array 52. A protective layer 54 is further formed over the conductor substrate 51 to protect the device against moisture and impacts.

FIGS. 5A-5H illustrate a method of fabricating a CMOS image sensor according to the present invention.

Figure 5A:
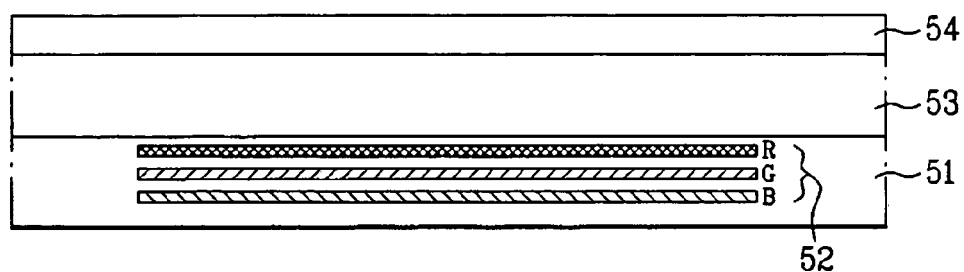
FIGS. 5A-5H are cross-sectional views of the CMOS image sensor of FIG. 4 fabricated in accordance with an exemplary method the present invention.

Referring to FIG. 5A, a pixel array 52, including photodiodes sensing R, G, and B signals to differ in thickness, is formed in a photodiode region by selectively performing impurity ion implantation on a semiconductor substrate 51. In doing so, the red (R) photodiode is formed deepest. The green (G) and blue (B) photodiodes are sequentially formed on the red photodiode. The red photodiode is embedded in the semiconductor substrate 51 to have a predetermined depth from a surface of the semiconductor substrate 51. The green photodiode is embedded in a first epitaxial layer formed by a first epitaxial process of the semiconductor substrate 51 to have a predetermined depth from a surface of the first epitaxial layer. The blue photodiode is embedded in a second epitaxial layer formed on the first epitaxial layer by a second epitaxial process of the semiconductor substrate 51 to have a predetermined depth from a surface of the second epitaxial layer. Signal processing devices (not shown) and multi-layered metal lines (not shown) connecting the respective elements are formed over the semiconductor substrate 51 having the pixel array 52. An insulating interlayer 53 is formed over the semiconductor substrate 51. A protective layer 54 is formed to protect the device against moisture and impacts by forming an oxide layer on the insulating interlayer 53.

Figure 5B:
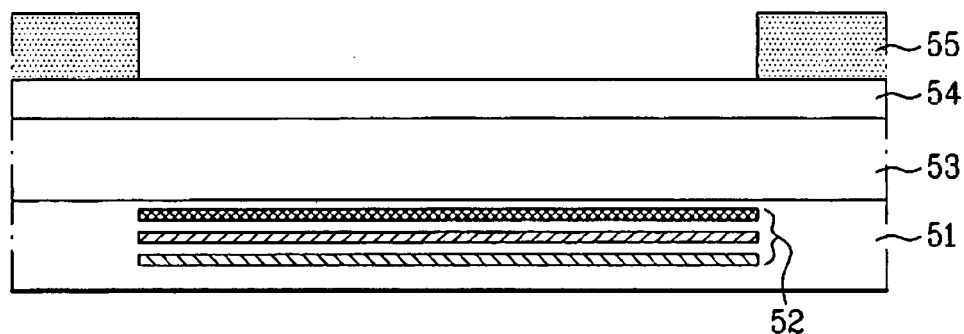

Referring to FIG. 5B, the protective layer 54 is coated with photoresist, which is selectively patterned by exposure and development steps to form a photoresist pattern 55 for exposing a portion of the protective layer 54 that overlaps the pixel array 32.

Figure 5C:
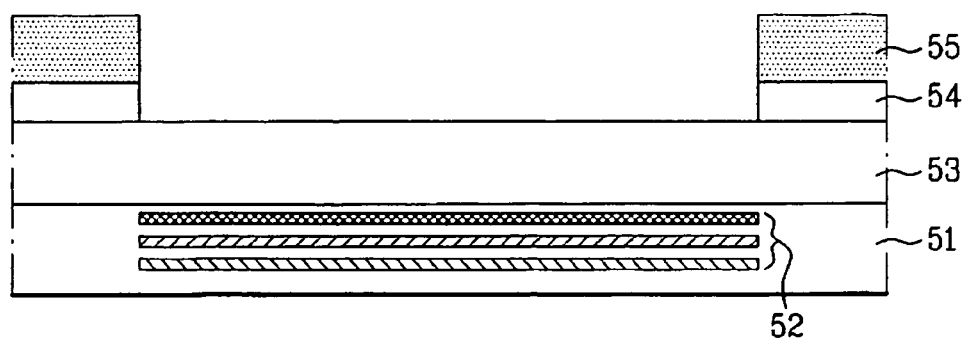

Referring to FIG. 5C, the exposed portion of the protective layer 54 is selectively removed using the patterned photoresist 55 as a mask to form a pad opening for exposing a metal pad formed in a pad area of the semiconductor substrate 51.

Figure 5D:
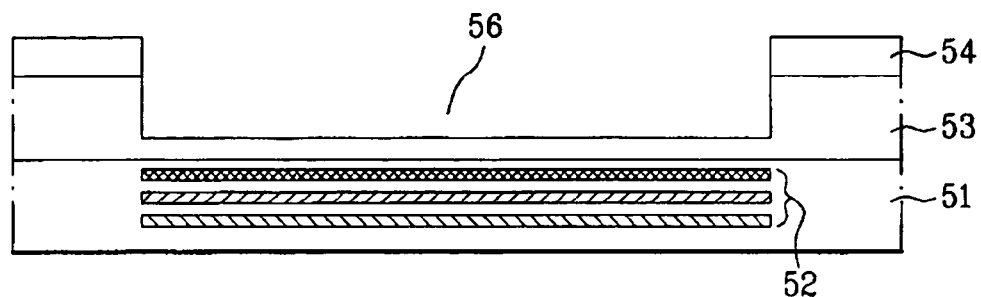

Referring to FIG. 5D, the photoresist 55 is removed. Photolithography is selectively carried out on the insulating interlayer 53 on the pixel array 52, including a dry etching process, to form a trench 56 having a predetermined depth from its surface. Hence, the trench 56 is formed in the insulating interlayer 53 on the pixel array 52 to enhance photosensitivity by reducing a distance between the pixel array 52 and microlenses that will be formed later.

Figure 5E:
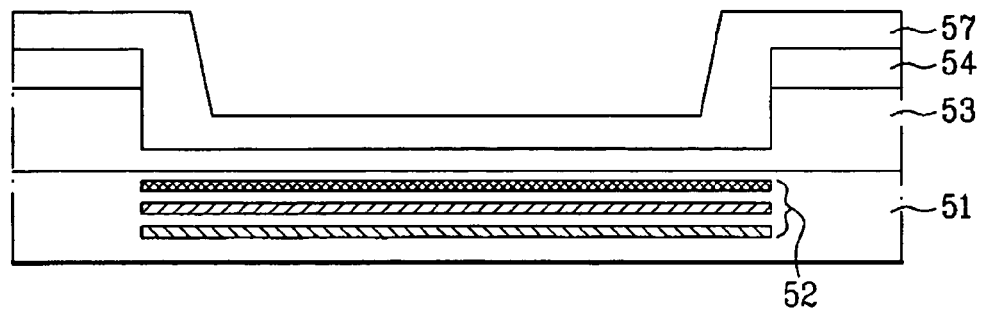

Referring to FIG. 5E, a high-density plasma oxide layer 57 is formed over the semiconductor substrate 51, including the trench 56, by high-density plasma chemical vapor deposition, to provide a uniform incline to a profile of the insulating interlayer 53 of the trench 56. In particular, high-density plasma chemical vapor deposition is performed to etch a projected edge of an insulating layer by having ions collide vertically with a structure, including metal lines, and to deposit the insulating layer in a gap having a high aspect ratio between the metal lines according to the high degree of integration of a semiconductor device. A portion of the high-density plasma oxide layer 57, namely, on a sidewall of the trench 56, is formed as a straight incline and is therefore thinner than the remainder of the layer.

Figure 5F:
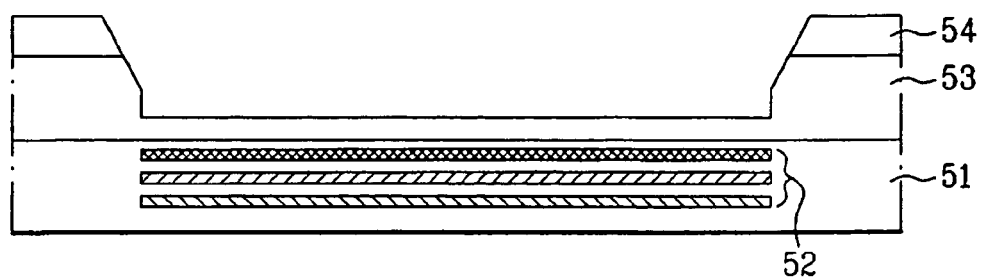

Referring to FIG. 5F, the high-density plasma oxide layer 57 is removed by etching to transfer its uniform inclination to corresponding portions of each of the protective layer 54 and the insulating interlayer 53 at the sidewall of the trench 56. In doing so, inclined portions of the protective layer 54 and the insulating interlayer 53 are formed.

Figure 5G:
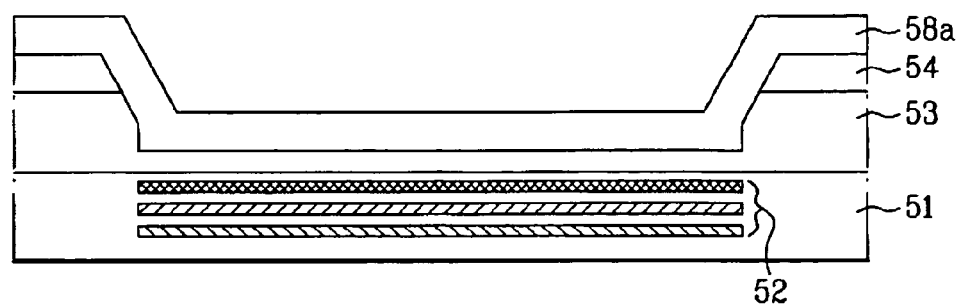

Referring to FIG. 5G, the semiconductor substrate 51, including the trench 56 having the inclined sidewalls, is coated with a microlens photoresist layer 58a. In forming the microlens photoresist layer 58a, since the sidewalls of the trench 56 are inclined, a uniform coating thickness of the photoresist layer 58a can be obtained without generating striation.

Figure 5H:
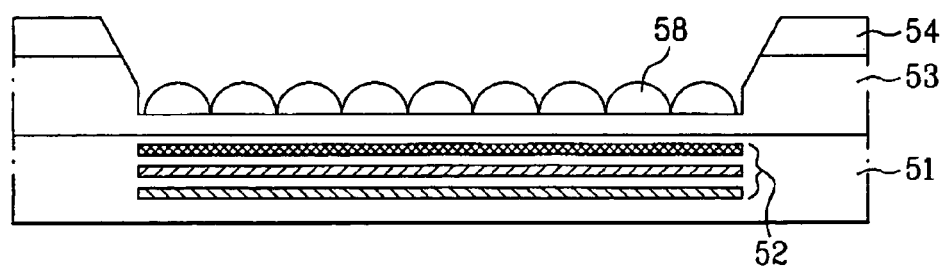

Referring to FIG. 5H, the microlens photoresist layer 58a is selectively patterned. A reflowing process is carried out on the patterned photoresist layer to form a plurality of microlenses 58 on the insulating interlayer 53 within the trench 56, such that the microlenses 57 are spaced apart from one another. The reflowing process can be carried out using a hot plate or furnace. The curvature of the microlenses 58, which determines its focus characteristics, varies according to a heating and contracting operation. Subsequently, the microlenses 58 are hardened by applying ultraviolet radiation. By thus hardening the microlenses 58, their respective curvatures can be optimally maintained.

According to the present invention, light efficiency is raised by reducing a light path incident on the photodiode via the microlenses. In addition, by employing high-density plasma chemical vapor deposition to form and remove the high-density plasma oxide layer simultaneously, the sidewalls of the trench can be inclined. Hence, striation can be prevented in coating the microlens photoresist layer, whereby the photoresist layer can be formed to have a uniform thickness.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of fabricating a CMOS image sensor, comprising:

disposing a pixel array in a semiconductor substrate;

stacking an insulating interlayer and a protective layer on the semiconductor substrate, including the pixel array;

selectively removing a portion of the protective layer over the pixel array;

forming a trench in the insulating interlayer to coincide with the pixel array;

forming an inclined inner sidewall of the trench, the inclined inner sidewall including inner sidewall surfaces of the protective layer and the insulating interlayer; and forming a plurality of devices and metal lines on the substrate that do not overlap the pixel array;

forming an oxide layer over the semiconductor substrate by high density plasma chemical vapor deposition to provide a uniform incline to a profile of the insulating interlayer of the trench; and removing the oxide layer by etching to transfer its uniform inclination to corresponding portions of the protective layer and the insulating interlayer at the sidewall of the trench to impart a uniformly inclined surface sloping outwardly from the trench.

2. The method of claim 1, wherein the trench is formed to a depth for enhancing photosensitivity of the image senor.

3. The method of claim 1, further comprising:

forming a plurality of microlenses on the insulating interlayer within the trench.

4. The method of claim 3, further comprising:

hardening the microlenses using ultraviolet radiation.

* * * * *